United States Patent
Xia et al.

(10) Patent No.: US 9,998,106 B2
(45) Date of Patent: Jun. 12, 2018

(54) MEMRISTIVE RF SWITCHES

(71) Applicant: University of Massachusetts, Boston, MA (US)

(72) Inventors: Qiangfei Xia, Amherst, MA (US); Joseph Bardin, Amherst, MA (US); Shuang Pi, Amherst, MA (US)

(73) Assignee: University of Massachusetts, Boston, MA (US)

( * ) Notice: Subject to any disclaimer, the term of this patent is extended or adjusted under 35 U.S.C. 154(b) by 331 days.

(21) Appl. No.: 14/689,198

(22) Filed: Apr. 17, 2015

(65) Prior Publication Data

US 2015/0303376 A1    Oct. 22, 2015

Related U.S. Application Data

(60) Provisional application No. 61/980,884, filed on Apr. 17, 2014.

(51) Int. Cl.
*H01L 47/00* (2006.01)
*H03K 17/04* (2006.01)
*H01L 45/00* (2006.01)
*H01L 27/12* (2006.01)

(52) U.S. Cl.
CPC ........... *H03K 17/04* (2013.01); *H01L 45/085* (2013.01); *H01L 45/1226* (2013.01); *H01L 45/1253* (2013.01); *H01L 45/16* (2013.01); *H01L 27/1203* (2013.01)

(58) Field of Classification Search
CPC ..................................................... H03K 17/04
USPC ............................................................. 257/4
See application file for complete search history.

(56) References Cited

U.S. PATENT DOCUMENTS

| 8,081,129 | B1 * | 12/2011 | Santori | ................ | H01Q 1/2225 343/745 |
| 2011/0181347 | A1 * | 7/2011 | Pickett | ............... | G11C 13/0002 327/538 |
| 2011/0182107 | A1 * | 7/2011 | Wu | ........................ | H01L 45/145 365/148 |
| 2012/0175583 | A1 * | 7/2012 | Nugent | .................. | G06N 3/063 257/5 |
| 2012/0194967 | A1 * | 8/2012 | Keane | .................... | H01C 13/00 361/437 |

(Continued)

OTHER PUBLICATIONS

Baek, I. G., et al., "Multi-layer cross-point binary oxide resistive memory (OxRRAM) for post-NAND storage application", Electron Devices Meeting 2005. IEDM Technical Digest. IEEE Int, (2005), 750-753.

(Continued)

*Primary Examiner* — Ajay K Arora
(74) *Attorney, Agent, or Firm* — Schwegman Lundberg & Woessner, P.A.

(57) ABSTRACT

A memristive radio frequency (RF) switch circuit comprises a first metal electrode and a second metal electrode arranged on an insulating substrate and separated by an air gap, wherein the air gap is fifty nanometers (50 nm) or less, and wherein applying and removing an enabling voltage to the memristive RF switch enables the memristive RF switch to pass RF signals between the first electrode and the second electrode even when the enabling voltage is removed from the memristive switch, and wherein applying and removing a disabling voltage to the memristive switch disables the memristive switch.

13 Claims, 10 Drawing Sheets

(56) References Cited

U.S. PATENT DOCUMENTS

2016/0218285 A1* 7/2016 Wang .................. H01L 45/1608

OTHER PUBLICATIONS

Bernard, Y., et al., "Back-end-of-line compatible Conductive Bridging RAM based on Cu and SiO2", Microelectronic Engineering 88, (2011), 814-816.
Bid, Aveek, et al., "Temperature dependence of the resistance of metallic nanowires of diameter > 15 nm: Applicability of Block-Grüneisen theorem", Phys. Rev. B, 74, 035426, (2006), 8 pgs.
Borghetti, Julien, et al., "Memristive' switches enable 'stateful' logic operations via material implication", Nature 464, (2010), 873-876.
Brown, Elliott R., "RF-MEMS Switches for Reconfigurable Integrated Circuits", IEEE vol. 46, No. 11, (Nov. 1998), 13 pgs.
Chua, Leon O., "Memristor—the missing circuit element", Circuit Theory, IEEE Trans. on 18, (1971), 507-519.
Czaplewski, Davud A., et al., "RF MEMS switches with RuO2—Au contacts cycled to 10 billion cycles", Microelectromechanical Systems, Journal of 22, (2013), 655-661.
El-Hinnawy, Nabil, et al., "A 7.3 THz Cut-Off Frequency, Inline, Chalcogenide Phase-Change RF Switch Using an Independent Resistive Heater for Thermal Actuation", Compound Semiconductor Integrated Circuit Symposium (CSICS), 2013 IEEE, (2013), 4 pgs.
Govoreanu, B., et al., "10×10 nm2 Hf/HfOx crossbar resistive RAM with excellent performance, reliability and low-energy operation", Electron Devices Meeting (IEDM), 2011 IEEE Int. 31.6.1-31.6.4, (2011), 4 pgs.
Granger-Jones, Marcus, et al., "A broadband high dynamic range voltage controlled attenuator MMIC with IIP3 > +47dBm over entire 30dB analog control range", Microwave Symposium Digest (MTT), IEEE MTT-S Int. (2011)., (2011), 4 pgs.
Griffiths, David J., "Introduction to Electrodynamics", Prentice Hall, Upper Saddle River, (1999), 596 pgs.
Hillman, C., et al., "An Ultra-low Loss Millimeter-wave Solid State Switch Technology Based on the Metal-Insulator—Transition of Vanadium Dioxide", Microwave Symposium Digest, 2014 IEEE MTT-S Int., (2014), 4 pgs.
Hummel, R. E., et al., "Activation energy for electrotransport in thin silver and gold films", Thin Solid Films 25, (1975), 335-342.
Jo, Sung Hyun, et al., "Nanoscale memristor device as synapse in neuromorphic systems", Nano Lett. 10, , (2010)., (2010), 1297-1301.
Kim, H. C., et al., "Hickness dependence on the thermal stability of silver thin films", Appl. Phys. Lett. 81, Kim, H. C., Alford, T. L. & Alle, D. R. T. , (2002)., (2002), 4287-4289.
Kohman, G. T., "Silver migration in electrical insulation", Bell Syst. Tech. J., 34(6), (1955), 1115-1147.
Kozicki, Michael N., et al., "Nanoscale memory elements based on solid-state electrolytes", IEEE Trans. on Nanotech. 4, (2005), 331-338.
Lee, Myoung-Jae, et al., "A fast, high-endurance and scalable non-volatile memory device made from asymmetric Ta2O5-x/TaO2-x bilayer structures", Nature Materials 10, (2011), 625-630.
Li, Zhenbiao, et al., "15-GHz Fully Integrated nMOS switches in a 0.13-μm CMOS process", Solid-State Circuit, IEEE J. 40, (2005), 2323-2328.
Marks, Roger B., "A Multiline Method of Network Analyzer Calibration", IEEE Transactions on Microwave Theory and Techniques, 39(7), (1991), 1205-1215.
McBrayer, J. D., "Diffusion of metals in silicon oxide", J. Electrochem. Soc.: Solid-State Science and Technology 133, (1986), 1242-1246.
Mehonic, Adnan, et al., "Resistive switching in silicon suboxide films", Journal of Applied Physics 111, 074507, (2012), 10 pgs.
Moon, Jeong-Sun, et al., "Development toward High-power Sub-1-ohm DC-67 GHz RF Switches using Phase Change Materials for Reconfigurable RF Front-end", Microwave Symposium Digest, 2014 IEEE MTT-S Int., (2014), 3 pgs.
Morin, F. J., "Oxides which show a metal-to-insulator transition at the Neel temperature", Phys. Rev. Lett. 3, (1959), 34-36.
Mott, N. F., et al., "Metal-insulator transition in VO2, Ti2O3 and Ti2-xVxO3", Philosophical Magazine. 30, (1974), 389-402.
Nessel, James A., et al., "A novel nanoionics-based switch for microwave applications", Microwave Symposium Digest, 2008 IEEE MTT-S Int, (2008), 1051-1054.
Pi, Shuang, et al., "Cross point arrays of 8 nm × 8 nm memristive devices fabricated with nanoimprint lithography", Journal of Vacuum Science Technology B 31, 06FA02, (2013), 7 pgs.
Pickett, Matthew D., et al., "Sub-100 fJ and sub-nanosecond thermally driven threshold switching in niobium oxide crosspoint nanodevices", Nanotechnology 23, 215202, (2012), 10 pgs.
Rebeiz, Gabriel M., et al., "Tuning in to RF MEMS", Microwave Magazine, IEEE 10, (Oct. 2009), 55-72.
Shim, Yonghyun, "RF switches using phase change materials", Micro Electro Mechanical Systems (MEMS), 2013 IEEE 26th Int. Conference, (2013), 237-240.
Strukov, Dmitri B., et al., "The missing memristor found", Nature 453, (2008), 80-83.
Sun, Haitao, et al., "Direct observation of conversion between threshold switching and memory switching induced by conductive filament morphology", Adv. Funct. Mat. 24, (2014), 5679-5686.
Szot, Krzysztof, et al., "Switching the electrical resistance of individual dislocations in single-crystalline SrTiO3", Nature Materials 5, (2006), 312-320.
Tappertzhofen, Stefan, et al., "Generic relevance of counter charges for cation-based nanoscale resistive switching memories", ACS Nano 7, (2013), 6396-6402.
Terabe, K, et al., "Quantized conductance atomic switch", Nature 433, (2005), 47-50.
Terabe, K., et al., "Formation and disappearance of a nanoscale silver cluster realized by solid electrochemical reaction", J. Appl. Phys. 91, 10110, (Jun. 15, 2002), 6 pgs.
Tian, Xuezeng, et al., "Bipolar Electrochemical Mechanism for Mass Transfer in Nanoionic Resistive Memories", Adv. Mat. 26, (2014), 3649-3654.
Torrezan, Antonio C., et al., "Sub-nanosecond switching of a tantalum oxide memristor", Nanotechnology 22, 485203, (2011), 8 pgs.
Tsuruoka, Tohru, et al., "Effects of moisture on the switching characteristics of oxide-based, gapless-type atomic switche", Adv. Funct. Mat. 22, (2012), 70-77.
Valov, Ilia, et al., "Electrochemical metallization memories—fundamentals, applications, prospects", Nanotechnology 22, 254003, (2011), 22 pgs.
Wang, Muzhi, et al., "A Low-Loss Directly Heated Two-Port RF Phase Change Switch", Electron Dev. Lett. IEEE 34, (2014), 3 pgs.
Wang, Muzhi, et al., "A low-loss directly heated two-port RF phase change switch", Electron Dev. Lett. IEEE 35,, (2014), 491-493.
Waser, Rainer, et al., "Nanoionics-based resistive switching memories", Nature Mater. 6, (2007), 833-840.
Waser, Rainer, et al., "Redox-based resistive switching memories—nanoionic mechanisms, prospects, and challenges", Adv. Mat. 21, (2009), 2632-2663.
Williams, Dylan F., "An Optimal Multiline TRL Calibration Algorithm", Proceedings of the 2003 IEEE International Microwave Symposium, (2003), 1819-1822.
Xia, Q., et al., "Memristor-CMOS hybrid integrated circuits for reconfigurable logic", Nano Lett. 9, , (2009)., (2009), 3640-3645.
Yang, J. Joshua, et al., "Memristive devices for computing", Nature Nanotech. 8,, (2013), 13-24.
Yang, J. Joshua, et al., "Memristive switching mechanism for metal/oxide/metal nanodevices", Nature Nanotech. 3, (2008), 429-433.
Yang, Yuchao, et al., "Electrochemical dynamics of nanoscale metallic inclusions in dielectrics", Nat. Commun. 5, 4232, (2014), 9 pgs.
Yang, Yuchao, "Electrochemical dynamics of nanoscale metallic inclusions in dielectrics", Nature Commun. 5, 4232, (2014), 9 pgs.

(56) References Cited

OTHER PUBLICATIONS

Yang, Yuchao, et al., "Observation of conducting filament growth in nanoscale resistive memories", Nature Commun. 3, 732, (2012), 8 pgs.

Yang, Yuchao, et al., "Observation of conducting filament growth in nanoscale resistive memories", Nature Communications 3,732, (2012), 8 pgs.

Yao, J Jason, "RF MEMS from a device perspective", J. Micromech. Microeng. 10, (2000), R9-R38.

Yao, Jun, et al., "Silicon Oxide: A Non-innocent Surface for Molecular Electronics and Nanoelectronics Studies", Journal of American Chemical Society, (2011), 941-948.

Zareie, Hosein, et al., "Compact high-power SPST and SP4T RF MEMS metal-contact switches", Microwave Theory and Techniques, IEEE Trans. 62, (2014), 297-305.

Zhirnov, Victor V., et al., "Scaling limits of resistive memories", Nanotechnology 22, 254027, Zhirnov, V. V., Meade, R., Cavin, R. K. & Sandhu, G. (2011)., (2011), 22 pgs.

\* cited by examiner

Typical I-V Curve

A. EBL

B. Tilted Evaporation of Au/Ni

C. Evaporation of Ag

D. Lift off

Top View

A

Au/Ni   Au/Ni

B

Side View

Au/Ni   Au/Ni

PMMA

Au/Ni   Au/Ni

Top View

C

D

Gap

Side View  75°

Ag

MEMRISTIVE RF SWITCHES

CLAIM OF BENEFIT

This application claims the benefit of U.S. Provisional Patent Application Ser. No. 61/980,884, filed on Apr. 17, 2014, which is hereby incorporated by reference in its entirety.

GOVERNMENT RIGHTS

This invention was made with United States Government support under Grant Number N66001-12-1-4217. The United States Government has certain rights in this invention.

BACKGROUND

Radio frequency (RF) systems include RF switches. An RF switch is a routing device that can be used to enable different circuit paths in the RF system. Some requirements of an RF switch are low insertion loss and high isolation. RF switches in use today are solid state switches in which a flow of electrons is turned on or off, such as by application of a gate voltage. Another type of RF switch is a microelectromechanical system (MEMS) RF switch that includes movable parts of sub-millimeter (mm) dimensions. Phase change material (PCM) RF switches may be switches that transition between a crystalline state and an amorphous state, or between a metallic phase and insulator phase through heating. MEMS RF switches and PCM RF switches typically have one or more disadvantages in terms of high power consumption, large size, limited reliability, low usable temperature range, and low speed. The present inventors have recognized a need for improvement in RF switches.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example and not by way of limitation, various embodiments discussed in the present document.

DETAILED DESCRIPTION

As explained above, there are tradeoffs involved in RF switches in use today. An approach to improve RF switch performance is to use a memristive switch. A memristive device is a non-linear passive device that has a pinched hysteresis current-voltage (I-V) curve. Memristive devices can be two terminal non-volatile resistance switches whose internal states are determined by the history of one or both of applied voltage and applied current.

Figure 1:
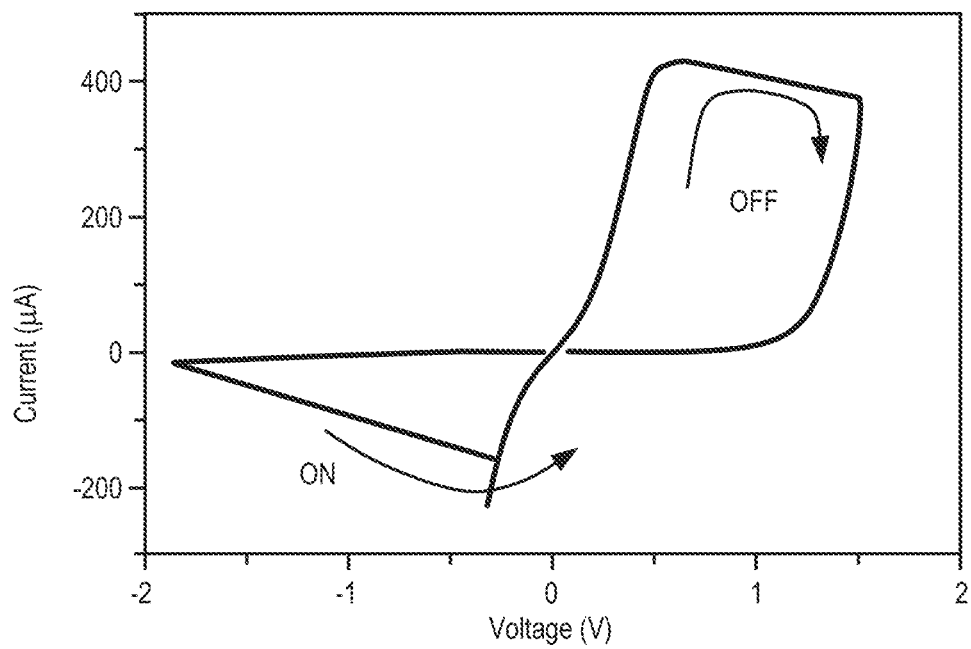
FIG. 1 shows an example of a memristive I-V curve.

FIG. 1 shows an example of a memristive I-V curve. A memristive device has a large off resistance (Roff) and a low on resistance (Ron). The lobes of the hysteresis curve correspond to an on-switching loop and an off switching loop. The device 'remembers' or maintains its previous state in the absence of current or voltage sufficient to change the state. This makes the memristive device a nonvolatile device because it does not need power to maintain its present state.

Figure 2:
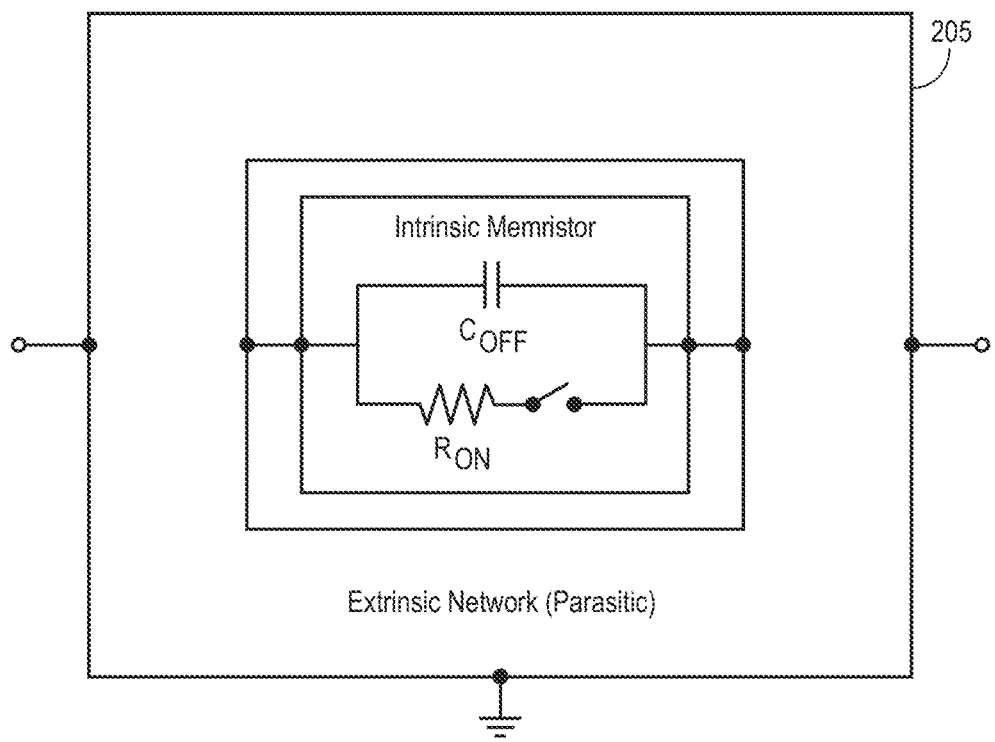
FIG. 2 shows a circuit schematic for a memristive switch circuit.

FIG. 2 shows a schematic of a circuit model for a memristive switch 205. Instead of performing a switching function by controlling a flow of electrons, a memristive switch uses a low resistance state as the on state and a high resistance state as the off state. Because a memristive switch is nonvolatile it uses low energy. The challenge for the design of a memristive RF switch is to meet the design requirements for use in an RF system. These requirements include low insertion loss and high isolation. Low insertion loss can be achieved by minimizing Ron and high isolation can be achieved through low capacitance in the 'off' state (Coff). Additional requirements for a memristive RF switch are a high Off/On resistance ratio (or high ON/OFF conductance ratio) to reduce performance degradation and a high cutoff frequency ($fc=1/(2\pi*RonCoff)$) to accommodate a wide wider badnwidth. A memristive RF switch can have a fast switching speed (e.g., a sub-nanosecond transition time between states and is low power (e.g., sub picojoule).

Figure 3A:
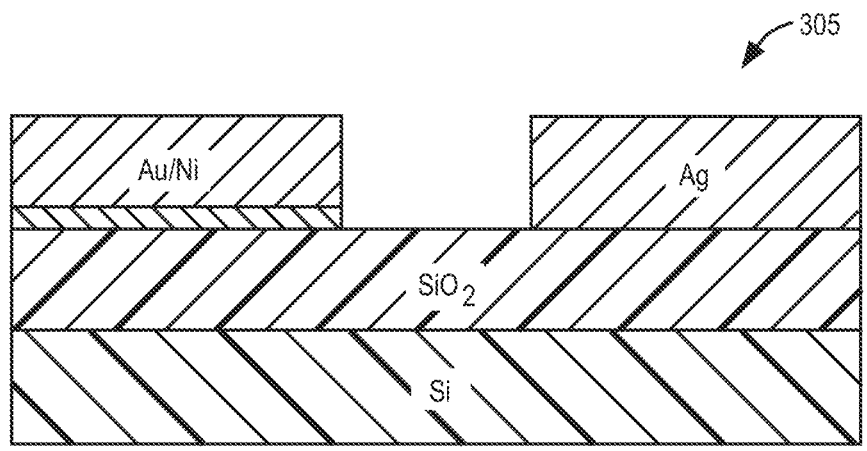
FIGS. 3A and 3B show an example of a memristive RF switch circuit.
Figure 3B:
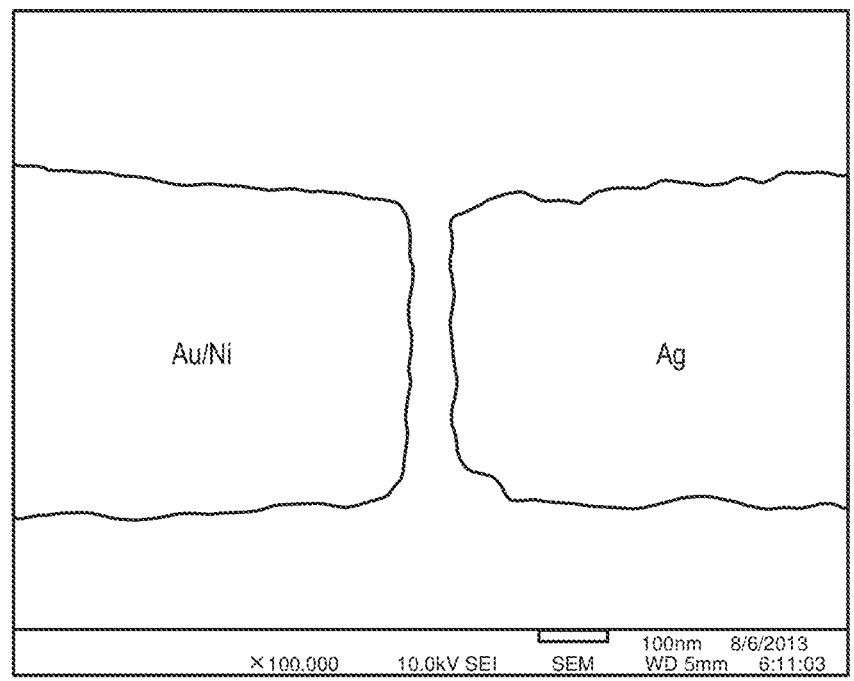

FIGS. 3A and 3B show an example of a memristive RF switch circuit 305. The switch is a nano-scale device. FIG. 3A is an illustration of the memristive RF switch circuit and FIG. 3B is a picture of a fabricated memristive RF switch circuit taken with a scanning electron microscope (SEM). The switch includes opposing electrodes and is a parallel device with an air gap separation between the electrodes. To enable the memristive switch a voltage (Vset) is applied between the electrodes. A conductive filament forms between the electrodes as a result of the voltage and the resistance of the switch changes to Ron. To turn the memristive switch off, a voltage of opposite polarity (Vreset) is applied between the electrodes to rupture the conductive filament and the resistance of the switch changes to Roff.

Figure 4A:
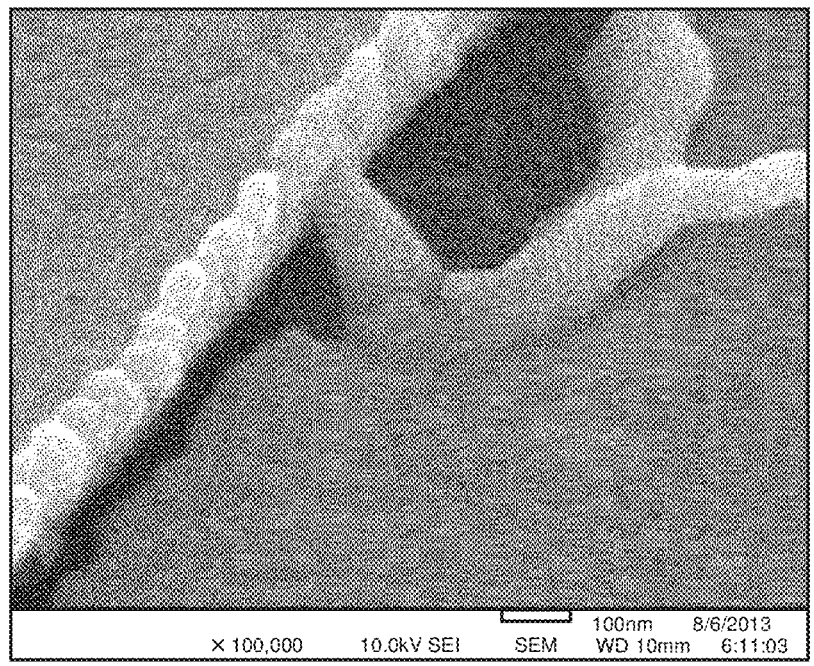
FIGS. 4A and 4B show a picture of an example of a memristive RF switch circuit in the on state.
Figure 4B:
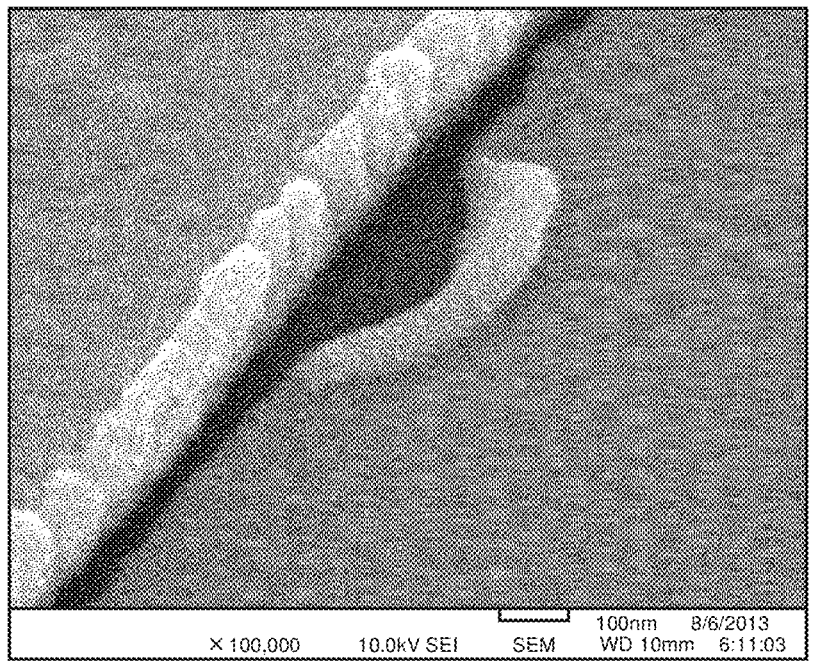

FIG. 4A shows a picture of an example of a memristive RF switch circuit in the on state. When the disabling voltage is applied, silver ions leave the electrode to form the conductive filament shown. FIG. 4B shows a picture of the memristive RF switch circuit in the off state. When the enabling voltage is applied, the conductive filament ruptures. It is desirable to keep the enabling and disabling voltages to a low value to allow the switch to be compatible with other electronic devices and to lower the energy requirement of the switch.

In some examples, the material comprising the electrodes may be electrochemically symmetric on both electrodes. For instance, both electrodes may be made of silver, which has a high conductance value ($\sigma$), or the same composition containing silver. With an air gap of fifty nanometers (50 nm), Ron was measured to be approximately 3.6 ohms (3.6Ω). Measured isolation was thirty decibels (30 dB) at forty gigahertz (40 GHz).

In the example shown in FIGS. 3A and 3B, the material of the electrodes is asymmetric. For instance, the first electrode (the right electrode in the example of FIG. 2) includes silver (Ag) and the other electrode includes nickel with gold (Au/Ni) or titanium with gold (Au/Ti). In variations, the electrodes can include one or a combination of silver, gold, platinum (Pt), aluminum (Al), and nickel. The electrodes are formed on a layer of thermal oxide (e.g., silicon dioxide ($SiO_2$)) arranged on top of a silicon substrate. The air gap results in a low dielectric constant which lowers the capacitance of the memristive switch and improves isolation. The thermal oxide layer reduces coupling to the silicon substrate.

Figure 5:
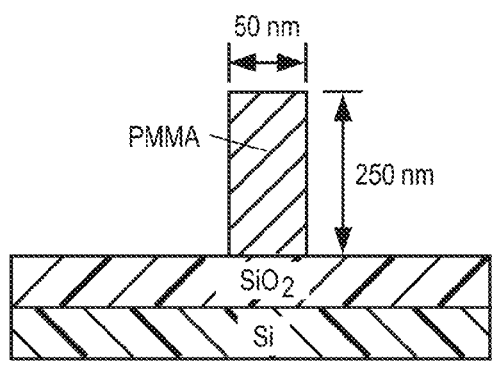
FIG. 5 illustrates portions of an example of a fabrication process for a memristive RF switch circuit.
Figure 5:
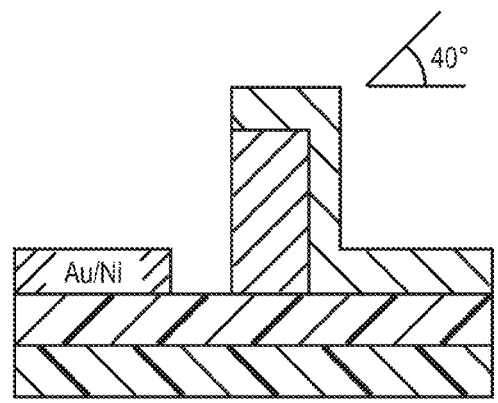
Figure 5:
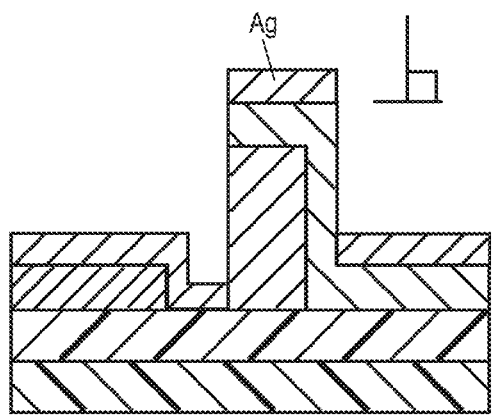
Figure 5:
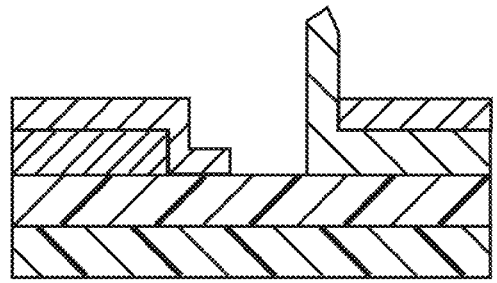

A memristive RF switch circuit can be formed using semiconductor device fabrication methods. FIG. 5 illustrates an example of portions of a fabrication process for a memristive RF switch circuit. Simplified side views of the device are shown in the example. In part A, resist (e.g., polymethyl methacrylate or PMMA) of the gap size (e.g., 50 nm) is deposited onto a layer of $SiO_2$ formed on a silicon wafer. In the example shown in FIG. 5, the height of the resist is 250 nm. In part B, a layer of gold and nickel (Au/Ni) is formed using a shadow evaporation technique.

In a shadow evaporation technique, an evaporation mask may be suspended above the insulating layer. The shadow image of the evaporation mask is projected onto the insulting layer. By setting different evaporation angles, features of nano-dimension can be created on the insulating layer, such as gap in the layers of gold and nickel that have a dimension of nanometers. In some examples, a layer of gold and nickel is formed by shadow evaporation with an oblique incidence angle of forty degrees (40°). The Au/Ni layer may include 40 nm of gold and 10 nm of Ni. In part C, a layer of silver (Ag) is formed using evaporation techniques with a normal angle of incidence. In part D, the resist is removed along with the portions of the Au/Ni and Ag layers on the resist layer. In some variations, ultrasonic agitation is used in the removal.

The on resistance Ron and the operation voltages (Vset, Vreset) are mainly related to the gap size. A smaller gap size results in a shorter conductive filament which can have a smaller resistance. A lower voltage is also required to form a filament across a smaller gap size. Device isolation is due to the off state capacitance Coff and is related to both the geometry of the switch and the substrate material.

Figure 6:
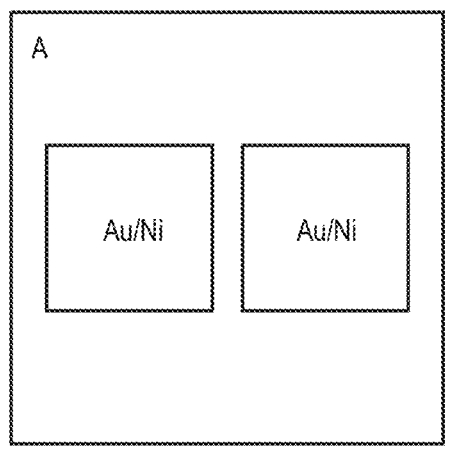
FIG. 6 illustrates portions of another example of a fabrication process for a memristive RF switch circuit.
Figure 6:
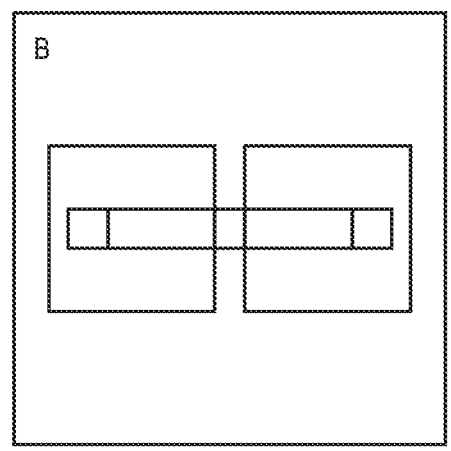
Figure 6:
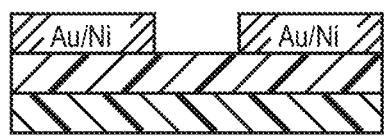
Figure 6:
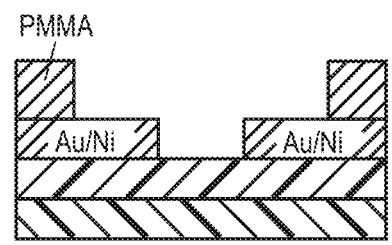
Figure 6:
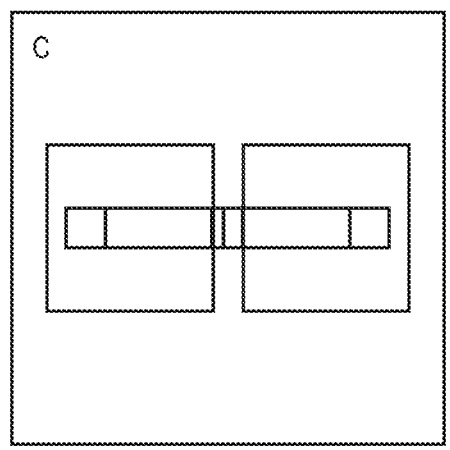
Figure 6:
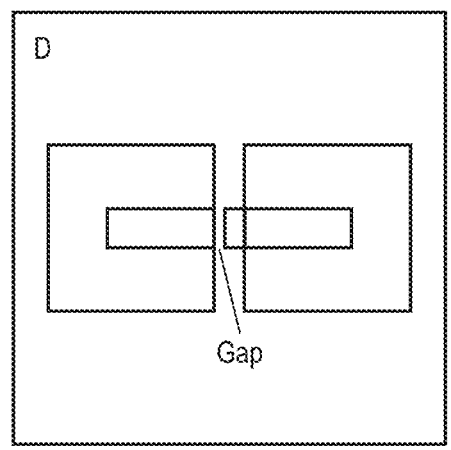
Figure 6:
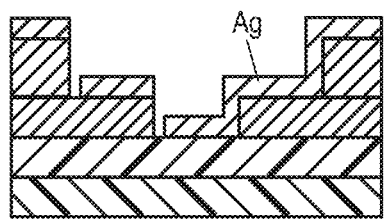
Figure 6:
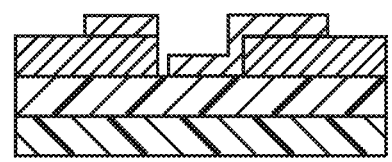

FIG. 6 illustrates another example of portions of a fabrication process for a memristive RF switch circuit. The process shown can be used to form a memristive RF switch circuit having an air gap of 10 nm. Reducing the air gap lowers the capacitance of the memristive switch to improve isolation and the thicker layer of thermal oxide reduces substrate coupling even further. Simplified top views and side views are shown in the example of FIG. 6. In part A, two electrode layers of gold and nickel are formed on the thermal oxide. The gold/nickel layers can be formed using shadow evaporation. In certain examples, the height of the gold in the layers is 120 nm, the height of the nickel in the layer is 8 nm, and the thickness of the thermal oxide layer is 500 nm. In part B, two layers of resist are formed on top of the gold/nickel layers. In part C, layers of silver are formed on the resist layers and the gold/nickel layers. In certain examples, the silver layers are formed using shadow evaporation with an incidence angle of 75°. In certain examples, the height of the silver layer is 50 nm. The distance between the silver layer shown in the middle and the gold/nickel layer shown to the left is 10 nm. This smaller gap is produced by the dimensions of the resist structures and using the steeper angle in the shadow evaporation technique. In part D, the resist layers and portions of the silver layers are removed. In some variations, acetone solution is used to remove the resist layers and portions of the layers.

In some examples, one or more shielding layers are added between the memristive RF switch and the substrate. Shielding may be useful to reduce or eliminate bulk mode resonances that may appear as transmission nulls in the frequency response of the RF switches. The shielding layers may include layers of metallization. In certain examples, the memristive RF switch includes an absorbing substrate that includes carbon-loaded epoxy.

Figure 7:
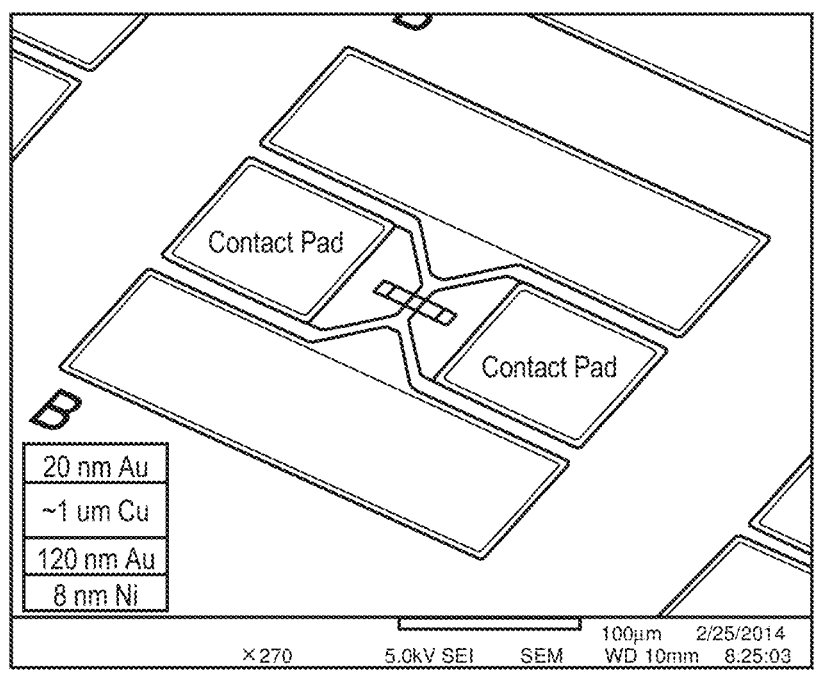
FIG. 7 shows a picture of another example of a memristive RF switch circuit.
Figure 7:
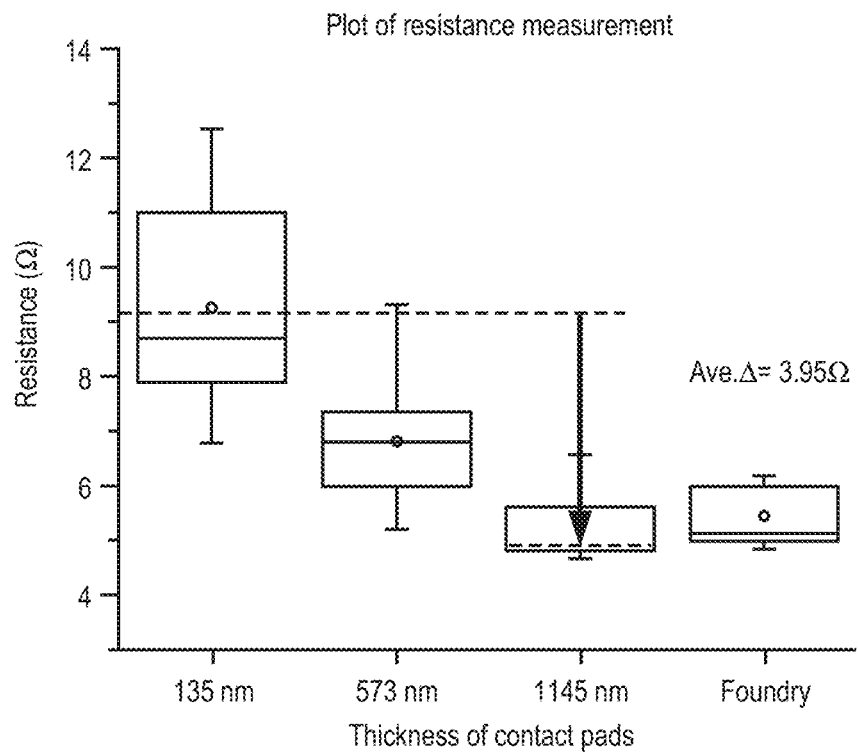

FIG. 7 shows a picture of another example of a memristive RF switch circuit. The memristive RF switch includes contact pads. As shown in the lower left, the contact pads include a base gold/nickel layer with a copper (Cu) layer above the gold/nickel layer. Above the copper layer is a gold layer. In the example shown, the nickel in the gold nickel layer has a height of 8 nm, the gold in the gold/nickel layer has a height of 120 nm, the copper layer has a height of 1 micrometer (1 μm), and the top sold layer has a height of 20 nm. On either side of the contact pads and memristive RF switch are ground planes.

The memristive RF switch circuit in FIG. 7 includes asymmetric electrodes of silver and gold/nickel, a 10 nm air gap, and a thermal oxide thickness of 500 nm on an intrinsic silicon substrate. The measured Ron for the switch was about 8Ω. Resistance for just the conductive filament of the on state of the switch is about 3Ω. Other measured parameters include a resistance ratio greater than $10^{10}$, Vset equal to about two volts (2V), Vreset equal to about (−0.4V), Ron of 3.6Ω, Coff of 1.37 femtofarads, an insertion loss of 0.3 dB at 40 GHz, isolation of 30 dB at 40 GHz, and a cutoff frequency (fc) of about thirty-five terahertz (35 T).

The geometry of the conductive filament formed between the electrodes as a result of Vset may depend on the programming process. A higher current may lead to a filament with larger diameter and hence lower resistance, but this may also increase the energy required for programming. For a device fabricated with a 35 nm air gap, a continuous conductive filament was formed for compliance current as low as ten nanoamps (10 nA), but current of twenty milliamps (20 mA) ensured formation of a good quality conductive filament and a small value of Ron.

A larger size of air gap may lead to higher values of Ron. This larger value of Ron is sometimes due to isolated islands of metal material forming between the electrodes rather than a continuous metal filament. A smaller narrower gap size (e.g., 10 nm to 50 nm) results in a continuous filament with low on resistance. A smaller gap size may also increases the number of cycles of on and off switching before device failure. Additionally, reducing excess heat from the RF memristive switch during resetting or disabling the device improves cycle life.

Figure 8:
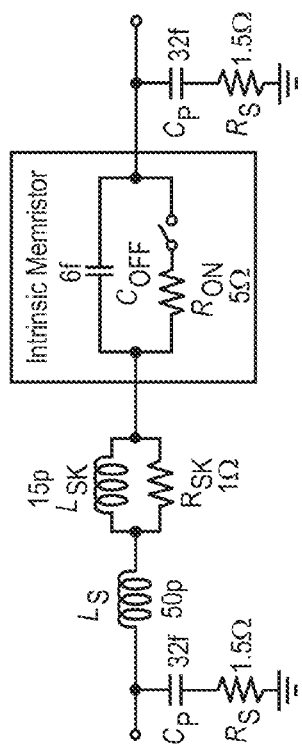
FIG. 8 shows an example of an RF circuit model for a memristive RF switch circuit including parasitic effects.
Figure 8:
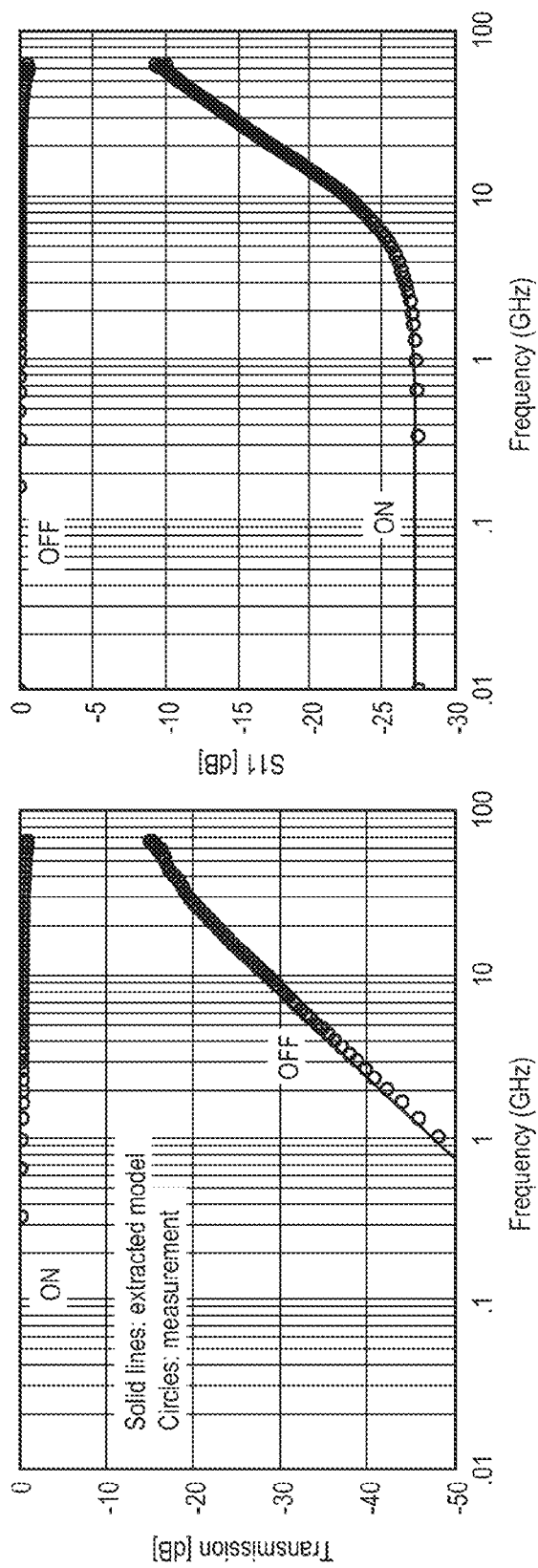

FIG. 8 shows an RF circuit model for the memristive RF switch circuit. In addition to the RF memristive switch, the RF circuit model accounts for parasitic effects specific to the particular test structure. The graphs show the agreement between the extracted circuit model and the actual device measurements.

Figure 9:
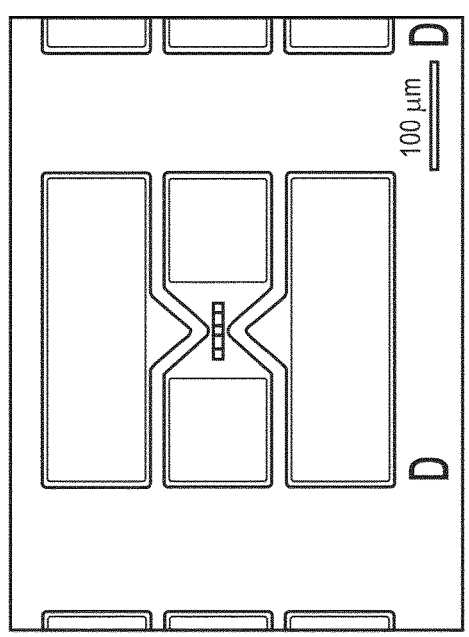
FIG. 9 shows an example of multiple memristive RF switch circuits electrically coupled together.
Figure 9:
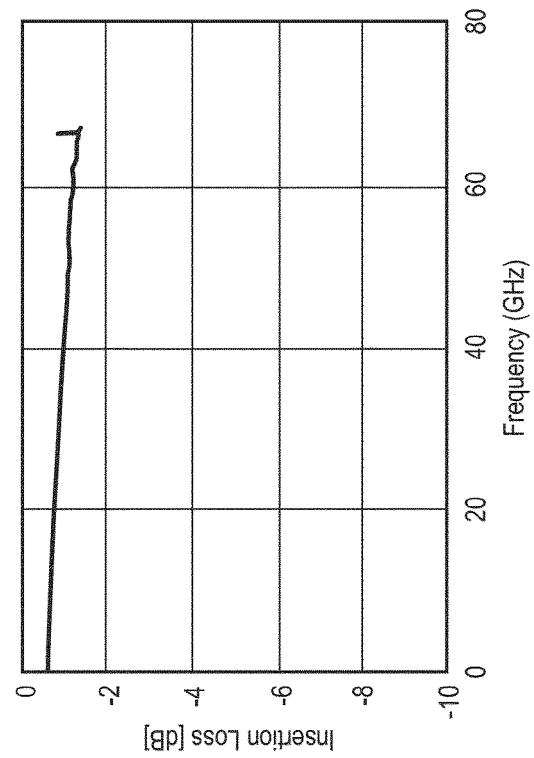
Figure 9:
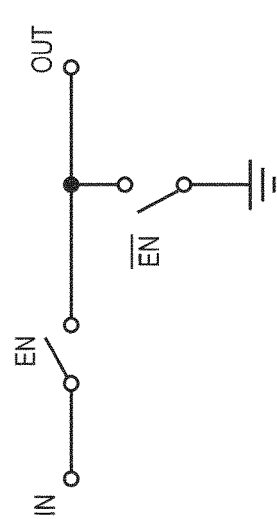
Figure 9:
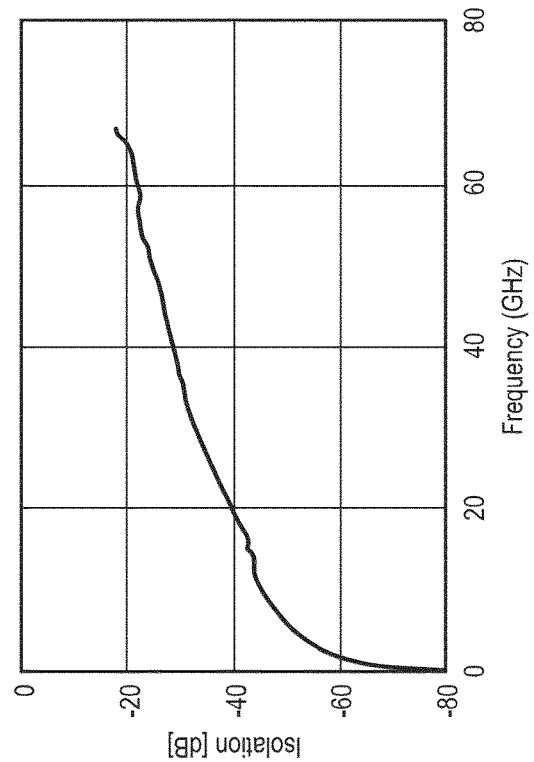

FIG. 9 shows an example of multiple memristive RF switch circuits electrically coupled together. At the left of FIG. 9 is a circuit diagram of the interconnection of two memristive RF switches. At the right of FIG. 9 is a picture of the fabricated switches. The first memristive RF switch circuit is formed between the contact pads. The second memristive RF switch circuit is connected between the rightmost contact pad and a ground plane.

Figure 11:
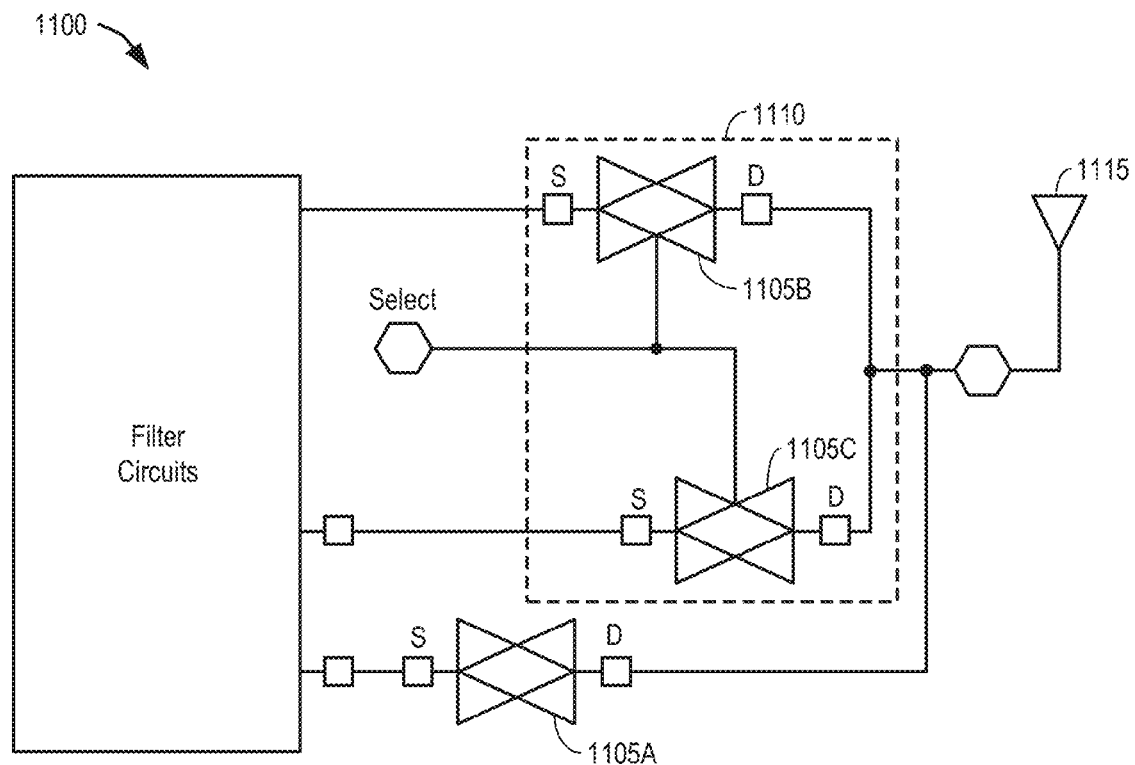
FIG. 11 illustrates a block diagram of portions of an example of an RF system.

The memristive RF switch circuit examples described herein have many applications in RF systems. FIG. 11 shows a block diagram of portions of an example of an RF system 1100. A memristive RF switch 1105A can be used to provide electrical conductivity with an RF antenna 1115. A memristive RF switch circuit can be used to enable RF circuit paths such as switching between a transmit circuit path and a receive circuit path. Multiple memristive RF switch circuits 1105B, 1105C can be electrically coupled together to form a multiplexer circuit 1110 to allow multiplexing between several RF circuit paths. This allows an RF system to easily change performance parameters such as by changing frequencies, or changing RF signal filtering options.

Figure 10:
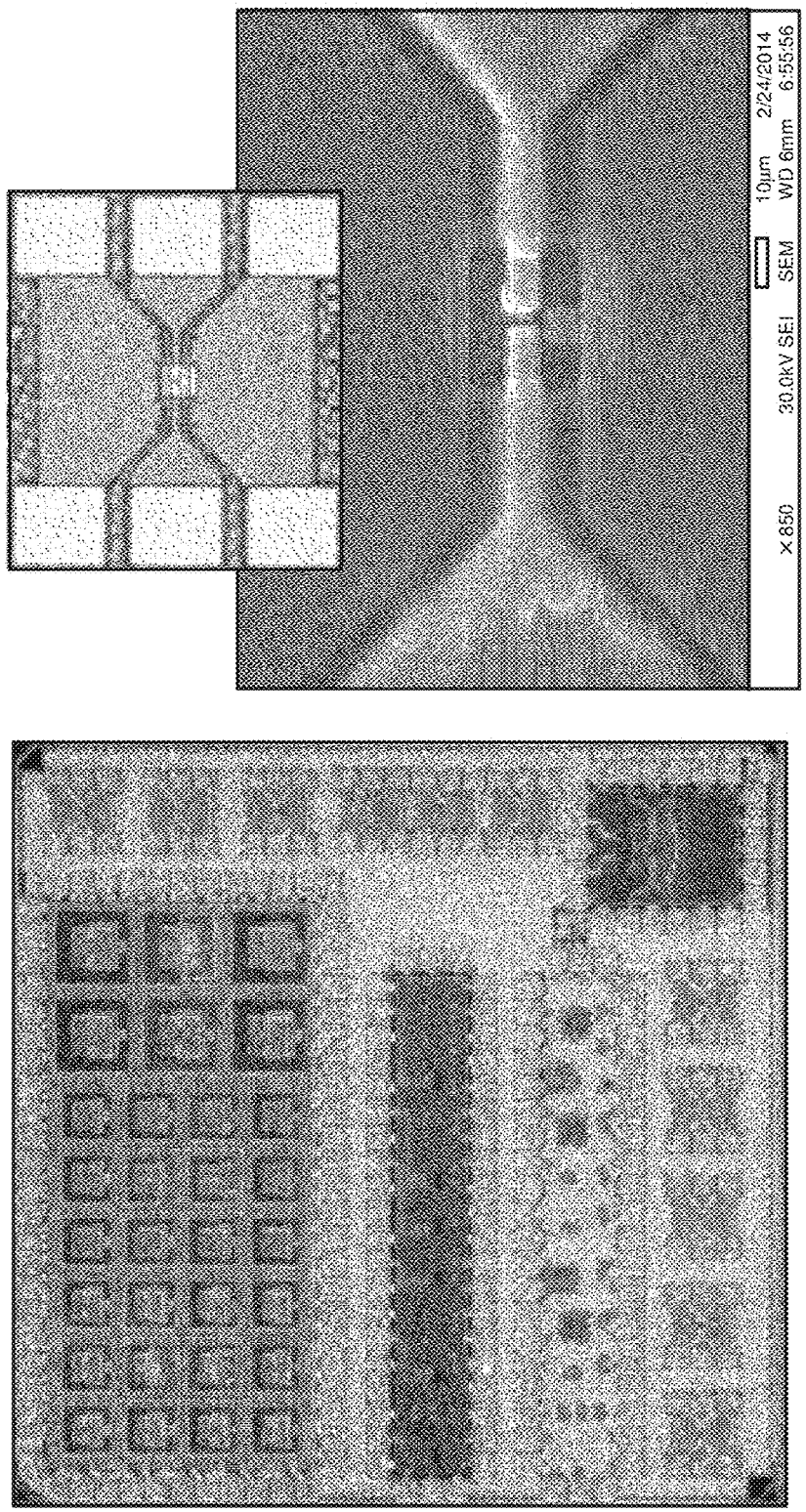
FIG. 10 is picture of a monolithic CMOS integrated circuit die.

FIG. 10 is picture of a monolithic complementary metal oxide semiconductor (CMOS) integrated circuit (IC) die. The die includes an opening in which to place an RF memristive device. The memristive RF switches are compatible with CMOS fabrication processes. Multiple memristive RF switches can be seen along a row at the bottom of the IC die and along a row at the right of the IC die. The other circuits shown on the IC die are CMOS circuits. The compatibility with CMOS processes allows memristive RF switches to be easily incorporated into electronic systems. For instance, the memristive RF switches can be incorporated into ICs for cellular telephones or other personal electronic devices. This allows a memristive RF switch for an antenna to be fabricated on the same die as the CMOS circuits that perform the desired functions.

ADDITIONAL NOTES

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. The above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A memristive radio frequency (RF) switch circuit comprising:
    a first metal electrode and a second metal electrode arranged on an insulating substrate and separated by an air gap, wherein the air gap is fifty nanometers (50 nm) or less, and
    wherein a conductance of at least one of the first and second electrodes enables a conductive path through the air gap when applying and removing an enabling voltage to the first and second metal electrodes to pass electrical signals with a signal frequency greater than one gigahertz (1 GHz) between the first electrode and the second electrode including when the enabling voltage is removed from the first and second electrodes, and wherein applying and removing a disabling voltage to the first and second electrodes disables the conductive path.

2. The memristive RF switch circuit of claim 1, wherein the on resistance (Ron) of the memristive RF switch circuit is less than four ohms (4Ω) when the enabling voltage is applied and removed.

3. The memristive RF switch of claim 1, wherein the air gap is ten nanometers (10 nm) or less.

4. The memristive RF switch circuit of claim 1, wherein the memristive RF switch circuit has a frequency response and a cutoff frequency of the frequency response is greater than thirty-five terahertz (35 THz).

5. The memristive RF switch circuit of claim 1, wherein the metal material of the first metal electrode and the second metal electrode migrates to form a conductive structure of the metal material across the air gap in response to the enabling voltage applied to the memristive RF switch circuit, and the conductive structure of the metal material ruptures in response to the disabling voltage applied to the memristive RF switch circuit.

6. The memristive RF switch circuit of claim 1, wherein the metal electrodes include one or more of silver, gold, platinum, aluminum, and nickel.

7. The memristive RF switch circuit of claim 1, wherein a metal material of the first metal electrode is different than a metal material of the second metal electrode.

8. An RF system comprising:
    an RF antenna;

a first memristive RF switch circuit conductively coupled to the RF antenna, wherein the first memristive RF switch circuit includes:

a first metal electrode and a second metal electrode arranged on an insulating substrate and separated by an air gap, wherein the air gap is fifty nanometers (50 nm) or less, and wherein a conductance of at least one of the first and second electrodes enables a conductive path through the air gap when applying and removing an enabling voltage to the first metal electrode and the second metal electrode to pass RF signals with a signal frequency greater than one gigahertz (1 GHz) between the first electrode and the second electrode including when the enabling voltage is removed from the first and second electrodes, and wherein applying and removing a disabling voltage to the first and second electrodes disables the conductive path.

9. The RF system of claim 8, including an integrated circuit (IC) die that includes:

the first memristive RF switch circuit; and a transmit circuit path configured to conduct signals having a frequency greater than 1 GHz, and wherein the first memristive RF switch circuit conductively couples the transmit circuit path to the RF antenna when enabled.

10. The RF system of claim 8, including an IC die, wherein the IC die includes:

the first memristive RF switch circuit; and a receive circuit path configured to conduct signals having a frequency greater than 1 GHz, and wherein the first memristive RF switch circuit conductively couples the receive circuit path to the RF antenna when enabled.

11. The RF system of claim 8, wherein the first memristive RF switch circuit is fabricated on an IC die, and wherein the IC die includes CMOS circuits fabricated on the same IC die.

12. The RF system of claim 8, wherein the first memristive RF switch circuit has a frequency response and a cutoff frequency of the frequency response is greater than thirty-five terahertz (35 THz).

13. The RF system of claim 8, including an IC die, wherein the IC die includes:

a plurality of memristive RF switch circuits conductively coupled together to form a multiplexer circuit, and a plurality of RF circuit paths conductively coupled to the memristive RF switch circuits.

* * * * *